US007171638B2

(12) United States Patent
Turakhia et al.

(10) Patent No.: US 7,171,638 B2
(45) Date of Patent: Jan. 30, 2007

(54) METHODS OF SCREENING ASIC DEFECTS USING INDEPENDENT COMPONENT ANALYSIS OF QUIESCENT CURRENT MEASUREMENTS

(75) Inventors: Ritesh P. Turakhia, Portland, OR (US); Robert B. Benware, Ft. Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 207 days.

(21) Appl. No.: 10/969,745

(22) Filed: Oct. 20, 2004

(65) Prior Publication Data

US 2006/0085771 A1 Apr. 20, 2006

(51) Int. Cl.
*G06F 17/50* (2006.01)
(52) U.S. Cl. .................. 716/4; 716/5; 716/6
(58) Field of Classification Search .............. 716/4–12, 716/19, 3; 703/2, 13–19; 702/57, 64, 65, 702/117
See application file for complete search history.

(56) References Cited

U.S. PATENT DOCUMENTS

| 5,889,409 | A | * | 3/1999 | Kalb, Jr. ..................... 324/765 |
| 5,944,847 | A | | 8/1999 | Sanada |
| 6,013,533 | A | * | 1/2000 | Sugasawara et al. .......... 438/10 |
| 6,043,662 | A | * | 3/2000 | Alers et al. .................. 324/520 |
| 6,140,832 | A | * | 10/2000 | Vu et al. .................... 324/765 |
| 6,175,244 | B1 | * | 1/2001 | Gattiker et al. ............. 324/765 |
| 6,242,934 | B1 | * | 6/2001 | Kalb, Jr. ..................... 324/765 |
| 6,380,753 | B1 | * | 4/2002 | Iino et al. ................... 324/765 |
| 6,623,992 | B1 | * | 9/2003 | Haehn et al. ................. 438/11 |
| 6,697,978 | B1 | * | 2/2004 | Bear et al. .................. 714/718 |
| 6,714,032 | B1 | * | 3/2004 | Reynick ..................... 324/765 |
| 6,807,655 | B1 | * | 10/2004 | Rehani et al. ................. 716/4 |
| 6,939,727 | B1 | * | 9/2005 | Allen, III et al. ............. 438/14 |
| 6,954,705 | B2 | * | 10/2005 | Benware ..................... 702/64 |
| 7,043,389 | B2 | * | 5/2006 | Plusquellic ................. 702/117 |
| 7,069,178 | B2 | * | 6/2006 | Cui et al. ................... 702/179 |

OTHER PUBLICATIONS

Johnson et al., Models and Algorithms for Bounds on Leakage in CMOS Circuits, Jun. 1999, IEEE Transactions on Computer-Aided Design of Integrated Circuits and Systems, vol. 18 No. 6 pp. 714-725.

(Continued)

*Primary Examiner*—Paul Dinh
*Assistant Examiner*—Nghia M. Doan
(74) *Attorney, Agent, or Firm*—Eric James Whitesell

(57) ABSTRACT

A method and computer program for screening defects in integrated circuit die includes steps of receiving as input measurements of quiescent current for each die in a sample lot of semiconductor die and generating a test matrix from the quiescent current measurements for each die in the sample lot. A de-mixing matrix is computed from independent component analysis that models passing die in the sample lot. A matrix of sources is generated as a product of the test matrix and the de-mixing matrix. The matrix of sources is normalized to zero mean and unit variance. A statistical limit of the passing die in the sample lot is selected from each of the sources in the normalized matrix of sources to determine a maximum and a minimum quiescent current limit for each of the sources. The maximum and the minimum quiescent current limit for each of the sources is generated as output.

10 Claims, 2 Drawing Sheets

OTHER PUBLICATIONS

Rajsuman R., Iddq Testing for CMOS VLSI, Apr. 2000, Proceedings of the IEEE, vol. 88 No. 4, pp. 544-566.

Sabade et al., Neighbor Current Ratio (NCR): A New Metric for Iddq Data Analysis, 2002, IEEE Computer Society, 9 pages.

Mao et al., QUIETEST: A Quiescent Current Testing Methodology for Detecting Leakage Faults, 1990, IEEE, pp. 280-283.

* cited by examiner

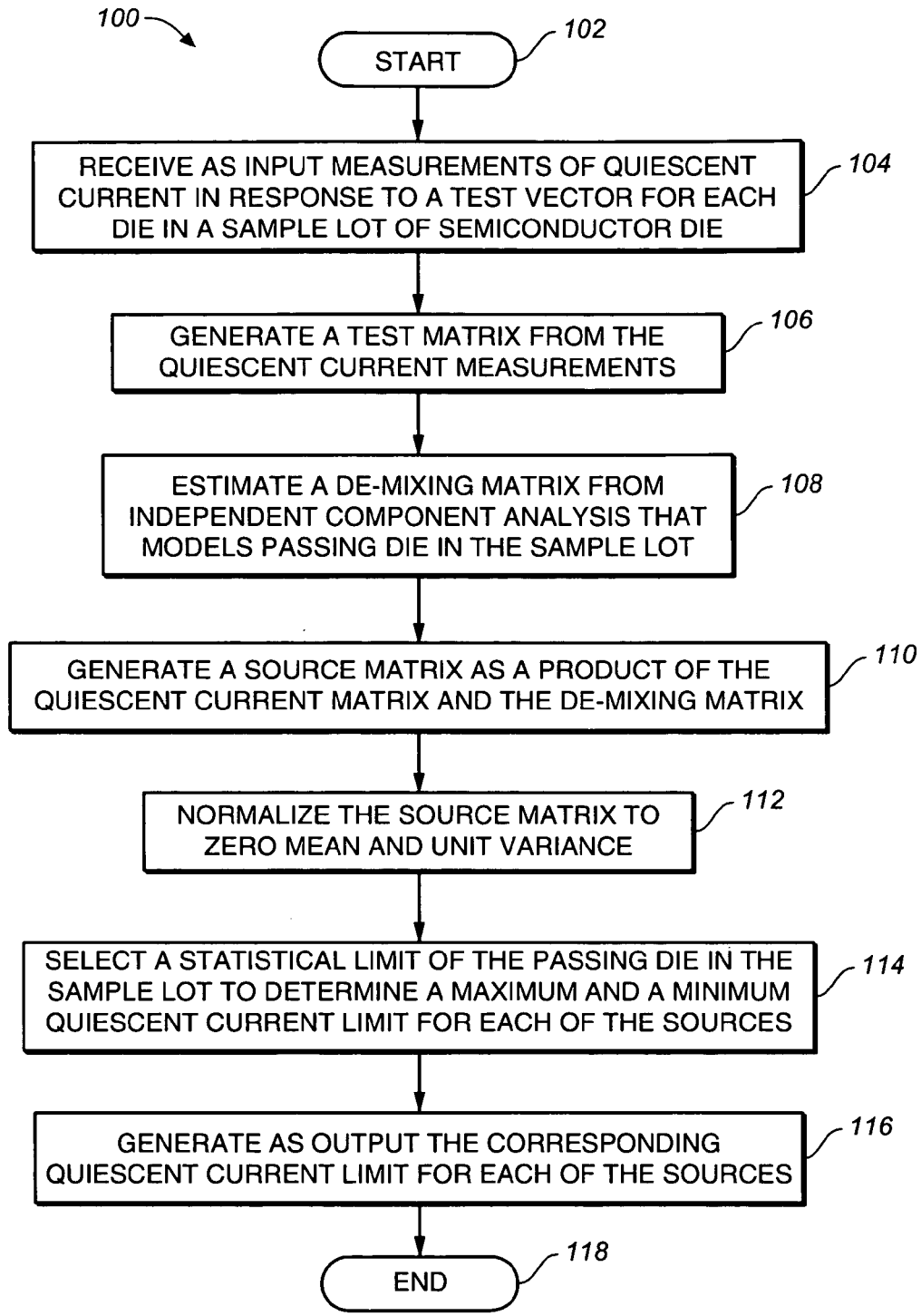
FIG._1

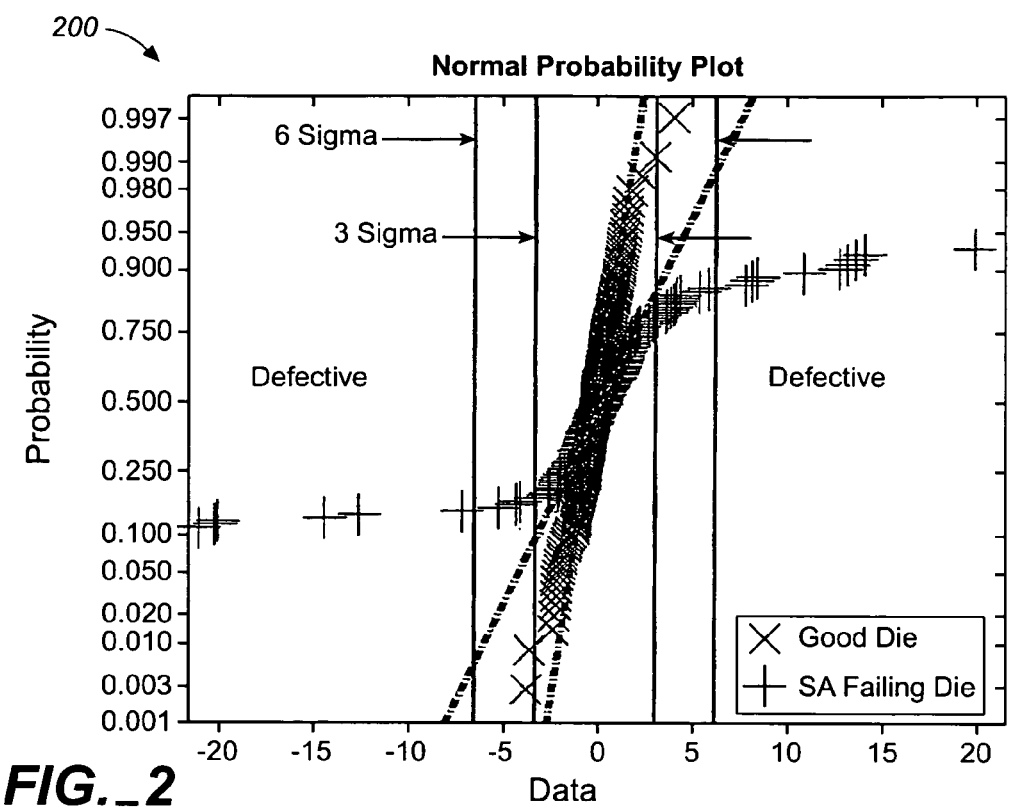
FIG._2
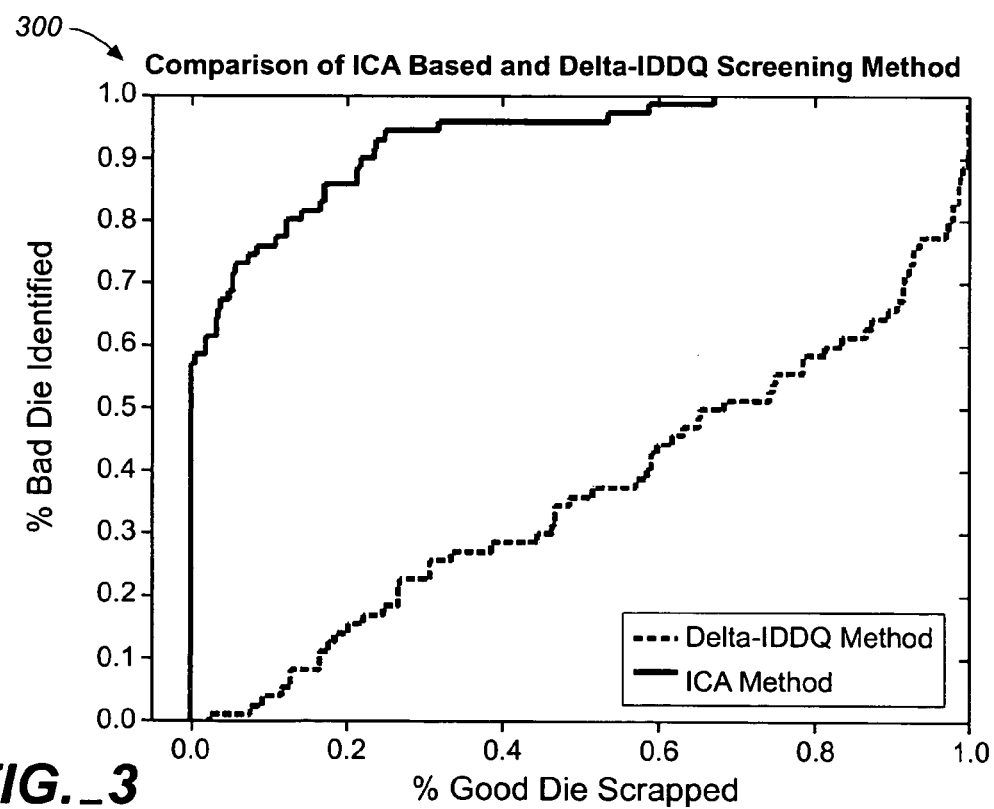
FIG._3

METHODS OF SCREENING ASIC DEFECTS USING INDEPENDENT COMPONENT ANALYSIS OF QUIESCENT CURRENT MEASUREMENTS

BACKGROUND OF THE INVENTION

1. Field of the Invention

The present invention is directed to the manufacture of integrated circuits. More specifically, but without limitation thereto, the present invention is directed to field of semiconductor die testing and defect screening.

2. Description of Related Art

Measurement of quiescent current (IDDQ) has proven to be an effective tool for screening defects during the manufacture and test of semiconductor die for integrated circuits (ICs) and application specific integrated circuits (ASICs). As semiconductor process technology progresses toward smaller transistor sizes, single limit based quiescent current screening becomes less effective due to a large variance in quiescent current for defect-free die with process shifts.

SUMMARY OF THE INVENTION

In one aspect of the present invention, a method includes steps of:
 (a) receiving as input measurements of quiescent current for each die in a sample lot of semiconductor die;
 (b) generating a test matrix from the quiescent current measurements for each die in the sample lot;
 (c) computing a de-mixing matrix from independent component analysis that models passing die in the sample lot;
 (d) generating a matrix of sources as a product of the test matrix and the de-mixing matrix;
 (e) normalizing the matrix of sources to zero mean and unit variance;
 (f) selecting a statistical limit of the passing die in the sample lot to determine a maximum and a minimum quiescent current limit for each of the sources; and
 (g) generating as output the maximum and the minimum quiescent current limit for each of the sources.

In another aspect of the present invention, a computer program product includes a medium for embodying a computer program for input to a computer and a computer program embodied in the medium for causing the computer to perform steps of:
 (a) receiving as input measurements of quiescent current for each die in a sample lot of semiconductor die;
 (b) generating a test matrix from the quiescent current measurements for each die in the sample lot;
 (c) computing a de-mixing matrix from independent component analysis that models passing die in the sample lot;
 (d) generating a matrix of sources as a product of the test matrix and the de-mixing matrix;
 (e) normalizing the matrix of sources to zero mean and unit variance;
 (f) selecting a statistical limit of the passing die in the sample lot to determine a maximum and a minimum quiescent current limit for each of the sources; and
 (g) generating as output the maximum and the minimum quiescent current limit for each of the sources.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a flow chart for a method of screening defects according to a method of the present invention;

FIG. 2 illustrates a normal probability plot of a cumulative distribution of known stuck-at fault failing die population and known passing die in a sample lot for a single source according to the method of FIG. 1; and FIG. 3 illustrates a plot illustrating the effectiveness of the method of FIG. 1 compared to the delta-IDDQ method.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

In the single limit method of screening defects used previously for screening defective semiconductor die, the quiescent die current is compared to an empirically determined limit or threshold value above which the die is likely to be defective. If the quiescent current exceeds the limit value, then the die is classified as defective. However, the large variance in quiescent current in defect-free die increases the difficulty of differentiating between defect-free die and defective die using a single limit or threshold.

The drive and leakage currents in a CMOS device depend mainly on the length of the gate and the thickness of the gate insulation material. In deep sub-micron (DSM) process technologies, strict precision is required in the fabrication process. However, it is impractical to achieve zero deviation from the dimension and shape specifications in the gate structure. The deviations in the gate length dimension and shape induced by the fabrication process are called process shifts. These deviations vary depending on the pattern densities, the dopant materials, and the lithography process. The process shifts result in unpredictable variation in quiescent current values for the fabricated device, thereby blurring the boundary defining the quiescent current behavior between defective and defect-free die.

Two previous methods of predicting quiescent current (IDDQ) for defect-free die are device delay vs. IDDQ and delta IDDQ. In the device delay vs. IDDQ method, the speed performance of a die is used to predict quiescent current. This method has been used successfully to reduce the variance in the measured quiescent current of defect-free die to an acceptable level. However, this method is becoming less effective in deep sub-micron process technologies, because the "on" characteristics of the die that include device speed are less indicative of the "off" characteristics that include quiescent current.

In the delta IDDQ method, quiescent current is measured for each of several different logic states applied to the die using test vectors of applied voltages to generate the logic states. The quiescent current measurement for each logic state defined by the test vector is used to predict the quiescent current for the next logic state. When the gates in the die transition to a logic state defined by a test vector as a stop location in the test, the quiescent current of the die is measured. A die is screened as defective if there is a significant difference between the predicted quiescent current from the previous stop location and the measured quiescent current in the new stop location. This method is successful in predicting a quiescent current value for the new stop location, however, defects in which the quiescent current is excessive for all stop locations, called common mode defects, are not successfully screened. Because common mode defects are more frequent than differential mode defects, the delta IDDQ method is unsatisfactory in present and future process technologies.

The assumption underlying quiescent current measurements is that in the quiescent state, any logic circuit will draw a minimum amount of current, and the presence of a defect will increase the quiescent current. The value of quiescent current for a given logic state may be considered a combined effect of certain device characteristics and physical parameters that are mutually independent. For example, gate oxide thickness and p-n junction leakage are two independent parameters that contribute to the observed values of quiescent current. These parameters may vary significantly from die to die and from wafer to wafer due to process variations, resulting in corresponding differences in quiescent current. The variation in quiescent current may be systematic or random in nature.

Independent component analysis (ICA) is a well known statistical tool that may be used to identify independent components or sources of quiescent current variation and can also provide information about how the observed quiescent current data is generated by a process of mixing the components. The mixing model for quiescent current values may be expressed in matrix notation by the following equation:

$$x = As \qquad (1)$$

The elements in the mixing matrix A are the weights for each source in the source matrix s that result in the values of measured quiescent current in the test matrix x.

Two random variables, $y_1$ and $y_2$, are independent only if their joint probability distribution may be factored into the product of their individual probability densities, that is, $$p(y_1, y_2) = p(y_1)p(y_2) \qquad (2)$$

The condition for independence also implies that the random variables $y_1$ and $y_2$ are uncorrelated. Also, maximizing independence between two random variables is equivalent to minimizing mutual information between the sources. Sources are random variables that are representative of the random variations in device characteristics and parameters that are independent of one another. An optimization algorithm may be constructed for isolating the sources using only the observed quiescent current values as follows.

In equation (1), only the quiescent current measurements in the test matrix x are known. Equation (1) may be rearranged to isolate the sources in the source matrix s by $$Wx = s \qquad (3)$$

$$\text{where } W = A^{-1} \qquad (4)$$

The de-mixing matrix W must be computed to estimate the source matrix s. Independent component analysis may be used to estimate the de-mixing matrix W subject to the constraints of independence explained above.

In one aspect of the present invention, a method includes steps of:
(a) receiving as input measurements of quiescent current for each die in a sample lot of semiconductor die;
(b) generating a test matrix from the quiescent current measurements for each die in the sample lot;
(c) computing a de-mixing matrix from independent component analysis that models passing die in the sample lot;
(d) generating a matrix of sources as a product of the test matrix and the de-mixing matrix;
(e) normalizing the matrix of sources to zero mean and unit variance;
(f) selecting a statistical limit of the passing die in the sample lot to determine a maximum and a minimum quiescent current limit for each of the sources; and
(g) generating as output the maximum and the minimum quiescent current limit for each of the sources.

FIG. 1 illustrates a flow chart 100 for a method of screening defects according to a method of the present invention.

Step 102 is the entry point of the flow chart 100.

In step 104, the quiescent current measurements in response to a test vector for each die in a sample lot of integrated circuit die are collected at a nominal supply voltage VDD.

In step 106, a test matrix is generated from the quiescent current measurements.

In step 108, the quiescent current data for the die that pass all other on-tester automated test equipment (ATE) tests in the sample lot are used to estimate a de-mixing matrix W that models good die behavior according to well known techniques of independent component analysis.

In step 110, the de-mixing matrix W is multiplied by the test matrix x for each die in the sample lot to generate a source matrix s according to equations (3) and (4) above. This step linearly transforms the test matrix x for each die into an estimate of the sources.

In step 112, the source matrix for the die in the sample lot is normalized to zero mean and unit variance according to well known techniques to facilitate separation of the distributions into passing and defective die.

In step 114, the normalized distribution of sources for known passing die is used to select a statistical limit of the passing die in the sample lot to determine a maximum and a minimum quiescent current limit for each of the sources. For example, the quiescent current limits may be set from the quiescent current values at the 6-sigma values of the population of the known passing die.

In step 116, the maximum and minimum quiescent current limits for each of the sources are generated as output. The number of known passing die that have values of quiescent current that lie outside the statistical limit is an indication of the effectiveness of the quiescent current limits set for screening defective die.

Step 118 is the exit point of the flow chart 100.

FIG. 2 illustrates a normal probability plot 200 of a cumulative distribution of known stuck-at fault failing die population and known passing die in a sample lot for a single source according to the method of FIG. 1. The probability axis represents the cumulative probability that source value for a plotted die comes from a normal distribution. The data axis represents the standard deviation of the source value for each plotted die. The dashed lines represent the normal probability distribution for normally distributed data. The normal probability plot 200 was generated from a sample die lot of 0.11 micron process ASIC devices.

In FIG. 2, the distribution of passing die in the normal probability plot 200 indicates that if the maximum and minimum quiescent current limits for passing die are set at about three sigma, then two passing die may be rejected as bad die, however, no stuck-at fault failing die will be accepted. On the other hand, if the maximum and minimum quiescent current limits for passing die are set at about six sigma, then none of the passing die are rejected at the cost of accepting a few stuck-at fault failing die. The failing die distribution has a greater spread, that is, heavier tails that deviate from the normal distribution as shown in FIG. 2. The wide deviation from the-normal distribution simplifies the task of outlier detection. Die that lie outside the maximum and minimum quiescent current limits are screened as defective. A plot is generated in the same manner as that of FIG. 2 to screen defective die for each source in the source matrix x.

FIG. 3 illustrates a plot 300 illustrating the effectiveness of the method of FIG. 1 compared to the delta-IDDQ method. The Y-axis represents the percentage of defective die identified, and the X-axis represents the percentage of good die falsely identified as defective.

In FIG. 3, as the as the quiescent current limits for passing die are progressively tightened, the number of good die falsely identified as defective eventually increases to 100 percent. However, at the point where 100 percent of the defective die are detected by the method of FIG. 1, only about 50 percent are detected by the delta-IDDQ method. At the point where 90 percent of the defective die are detected by the method of FIG. 1, only about 20 percent are detected by the delta-IDDQ method. Regardless of where the limits for passing die are set, the number of defective die detected vs. the number of good die falsely identified as defective is better for the method of FIG. 1 than for the delta-IDDQ method. As shown in the plot 300 of FIG. 3, the number of defective die detected by the delta-IDDQ method is about the same as the number of good die falsely identified as defective for the same ASIC device manufactured by 0.11 micron technology.

In contrast to previous methods for reducing variance in test data, the method of the present invention explains the sources of variance and each source's contribution towards quiescent current and also provides a clearer distinction between distributions of defective and defect-free quiescent current for a die lot.

In addition to quiescent current, other parameters may be used according to the method of the present invention to identify defective die, for example, gate oxide thickness, device channel length, p-n junction leakage, and device speed.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

The methods illustrated in the flowchart description above may be embodied in a computer program product and implemented by a computer according to well known programming techniques.

In another aspect of the present invention, a computer program product includes a medium for embodying a computer program for input to a computer and a computer program embodied in the medium for causing the computer to perform steps of:

(a) receiving as input measurements of quiescent current for each die in a sample lot of semiconductor die;

(b) generating a test matrix from the quiescent current measurements for each die in the sample lot;

(c) computing a de-mixing matrix from independent component analysis that models passing die in the sample lot;

(d) generating a matrix of sources as a product of the test matrix and the de-mixing matrix;

(e) normalizing the matrix of sources to zero mean and unit variance;

(f) selecting a statistical limit of the passing die in the sample lot to determine a maximum and a minimum quiescent current limit for each of the sources; and (g) generating as output the maximum and the minimum quiescent current limit for each of the sources.

While the invention herein disclosed has been described by means of specific embodiments and applications thereof, numerous modifications and variations could be made thereto by those skilled in the art without departing from the scope of the invention set forth in the following claims.

What is claimed is:

1. A method comprising steps of:

(a) receiving as input measurements of quiescent current for each die in a sample lot of semiconductor die;

(b) generating a test matrix from the quiescent current measurements for each die in the sample lot;

(c) computing a de-mixing matrix from independent component analysis that models passing die in the sample lot;

(d) generating a matrix of sources as a product of the test matrix and the de-mixing matrix;

(e) normalizing the matrix of sources to zero mean and unit variance;

(f) selecting a statistical limit of the passing die in the sample lot from each of the sources in the normalized matrix of sources to determine a maximum and a minimum quiescent current value limit for each of the sources;

(g) generating as output the maximum and the minimum quiescent current value limit for each of the sources; and (h) screening defective die that lie outside the maximum and the minimum quiescent current value limit for each of the sources.

2. The method of claim 1 wherein each die in the sample lot is manufactured by a deep sub-micron process.

3. A method comprising steps of:

(a) receiving as input measurements of a parameter for each die in a sample lot of semiconductor die;

(b) generating a test matrix from the parameter measurements for each die in the sample lot;

(c) computing a de-mixing matrix from independent component analysis that models passing die in the sample lot;

(d) generating a matrix of sources as a product of the test matrix and the de-mixing matrix;

(e) normalizing the matrix of sources to zero mean and unit variance;

(f) selecting a statistical limit of the passing die in the sample lot from each of the sources in the normalized matrix of sources to determine a maximum and a minimum parameter value limit for each of the sources;

(g) generating as output the maximum and the minimum parameter value limit for each of the sources; and (h) screening defective die that lie outside the maximum and the minimum quiescent current value limit for each of the sources.

4. The method of claim 3 wherein each die in the sample lot is manufactured by a deep sub-micron process.

5. The method of claim 3 wherein the parameter is one of gate oxide thickness, device channel length, p-n junction leakage, and device speed.

6. A computer program product comprising a medium for embodying a computer program for input to a computer and a computer program embodied in the medium for causing the computer to perform steps of:
  (a) receiving as input measurements of quiescent current for each die in a sample lot of semiconductor die;
  (b) generating a test matrix from the quiescent current measurements for each die in the sample lot;
  (c) computing a de-mixing matrix from independent component analysis that models passing die in the sample lot;
  (d) generating a matrix of sources as a product of the test matrix and the de-mixing matrix;
  (e) normalizing the matrix of sources to zero mean and unit variance;
  (f) selecting a statistical limit of the passing die in the sample lot from each of the sources in the normalized matrix of sources to determine a maximum and a minimum quiescent current limit for each of the sources;
  (g) generating as output the maximum and the minimum quiescent current limit for each of the sources; and
  (h) screening defective die that lie outside the maximum and the minimum quiescent current value limit for each of the sources.

7. The computer program product of claim 6 wherein each die in the sample lot is manufactured by a deep sub-micron process.

8. A computer program product comprising a medium for embodying a computer program for input to a computer and a computer program embodied in the medium for causing the computer to perform steps of:
  (a) receiving as input measurements of a parameter for each die in a sample lot of semiconductor die;
  (b) generating a test matrix from the parameter measurements for each die in the sample lot;
  (c) computing a de-mixing matrix from independent component analysis that models passing die in the sample lot;
  (d) generating a matrix of sources as a product of the test matrix and the de-mixing matrix;
  (e) normalizing the matrix of sources to zero mean and unit variance;
  (f) selecting a statistical limit of the passing die in the sample lot from each of the sources in the normalized matrix of sources to determine a maximum and a minimum parameter value limit for each of the sources;
  (g) generating as output the maximum and the minimum parameter value limit for each of the sources; and
  (h) screening defective die that lie outside the maximum and the minimum quiescent current value limit for each of the sources.

9. The computer program product of claim 8 wherein each die in the sample lot is manufactured by a deep sub-micron process.

10. The computer program product of claim 8 wherein the parameter is one of gate oxide thickness, device channel length, p-n junction leakage, and device speed.

* * * * *